United States Patent [19]
Nishibayashi et al.

[11] Patent Number: 5,417,798
[45] Date of Patent: May 23, 1995

[54] ETCHING METHOD

[75] Inventors: Yoshiki Nishibayashi; Naoji Fujimori, both of Hyogo, Japan

[73] Assignee: Sumitomo Electric Industries, Ltd., Osaka, Japan

[21] Appl. No.: 824,091

[22] Filed: Jan. 22, 1992

[30] Foreign Application Priority Data

Jan. 24, 1991 [JP] Japan .................................. 3-060821

[51] Int. Cl.$^6$ .......................................... H01L 21/00
[52] U.S. Cl. .................................... 216/67; 156/345; 204/192.35; 216/81
[58] Field of Search ................................ 156/643, 646; 204/298.31, 298.34, 298.02, 298.15, 192.32

[56] References Cited

U.S. PATENT DOCUMENTS

| | | | |
|---|---|---|---|
| 4,352,725 | 10/1982 | Tsukada | 204/192 E |
| 4,416,724 | 11/1983 | Fischer | 156/643 |
| 4,496,449 | 1/1985 | Rocca et al. | 204/298.36 |
| 4,957,591 | 9/1990 | Sato et al. | 156/646 |
| 5,160,405 | 11/1992 | Miyauchi | 156/646 |

FOREIGN PATENT DOCUMENTS

| | | |
|---|---|---|
| 0040081 | 11/1981 | European Pat. Off. . |
| 2496328 | 6/1982 | France . |
| 63-220525 | 9/1968 | Japan . |
| 56-085827 | 7/1981 | Japan . |
| 58-003635 | 1/1983 | Japan . |
| 59-46031 | 3/1984 | Japan . |
| 63-175427 | 7/1988 | Japan . |
| 1028922 | 1/1989 | Japan . |
| 5694745 | 7/1991 | Japan . |
| 04240725 | 8/1992 | Japan . |

OTHER PUBLICATIONS

Anonymous, "Grounding grid for flexible diode etcher—is inserted between substrate and counter electrodes, and grounded to substrate electrode dark space shield", World Patents Index Latest, Week 8616, Mar. 19, 1986, Derwent Publication Ltd. and Research Disclosure, vol. 263, No. 65, Mar. 1986.

N. N. Efremow et al, "Ion–beam–assisted etching of diamond", J. Vac. Sci. Technol. B3(1), pp. 416–418 Jan./Feb. 1985.

Sugita et al, "Carving seals and inlaying of patterns on a diamond surface by using microsputtering methods", Topics, Tokyo College of Science, Apr. 1988, pp. 40–41.

*Primary Examiner*—R. Bruce Breneman
*Assistant Examiner*—George Goudreau
*Attorney, Agent, or Firm*—Cushman, Darby & Cushman

[57] ABSTRACT

Reactive ion etching of diamond using oxygen plasma roughs the surface of diamond due to the strong bombardment of oxygen ions with various kinetic energy. A metal grid with holes is installed between the oxygen plasma and the diamond. Since the metal grid is biased in order to prevent oxygen plasma from being in contact with the diamond, the oxygen ions which have passed the grid will bombard the surface of the diamond with common, low energy. The etched surface becomes smooth.

3 Claims, 3 Drawing Sheets

ETCHING METHOD

BACKGROUND OF THE INVENTION

This invention relates to an etching method of diamond which will be applicable to fabrication of diamond devices, e.g. diodes, transistors or integrated circuits which make use of diamond as active semiconductor layers. Diamond attracts attention, because diamond has a possibility of making devices which can stably work under rigorous conditions, e.g. at high temperature or under the exposure of radioactive rays, or devices which can generate high output power.

Since diamond has a wide band gap of 5.5 eV, the temperature range in which diamond acts as an intrinsic semiconductor does not exist below 1400° C., at which diamond is still thermally stable. Accordingly, diamond devices should stably work at high temperature. Intrinsic semiconductor is defined as a semiconductor having the same number of electrons and holes. Thus, when temperature rises above the intrinsic region of a semiconductor, the semiconductor device would lose its function as an active device, e.g. amplification, rectification, oscillation, etc. Of course diamond is also chemically stable. The heat conductivity of diamond is 20 W/cmK, which is more than ten times larger than that of silicon (Si). Thus diamond also excels in heat diffusivity.

Diamond is favored with high carrier mobilities; electron mobility is 2000 cm$^2$/Vsec and hole mobility is 2100 cm$^2$/Vsec at 300 K. Furthermore, the dielectric constant of diamond is small ($\epsilon=5.5$). These advantages would make diamond a suitable material for manufacturing high speed devices or high frequency devices. In addition, diamond has a large breakdown voltage ($E=5\times10^6$ V/cm). Due to the advantage, diamond is deemed as a promising material for manufacturing high frequency devices with high output power.

Manufacturing these devices including diamond layers requires such a technique for forming various kinds of films on a substrate. In addition to the film forming technique, an etching technique, e.g. forming steps or grooves on a diamond film or removing unnecessary portions of a diamond film is indispensable.

Various etching techniques have been established for silicon (Si) semiconductor. The most pertinent technique should be chosen according to the purpose of etching. Diamond has chemical and physical properties different from silicon. Diamond is much stronger chemically or physically than silicon. Therefore, the etching technique of silicon is not applicable to the etching of diamond as it is.

N. N. Efremow had reported an etching method of diamond making use of ion beams. N. N. Efremow et al: J.Vac. Sci. Technol. B3(1), 1985, p416

However, this method was not a practical method for etching a diamond semiconductor with wide area. Reactive ion etching method (RIE) has been used for etching silicon. The RIE method is also applicable for wide silicon substrates. The RIE method is now inapplicable to diamond. However, this invention wishes to apply the RIE method to the diamond etching. A gas including oxygen was deemed to be a pertinent gas for etching diamond. However, the reactive etching method of diamond using oxygen plasma makes many random concave parts and convex parts on the surface of diamond. The roughness of the etched surface of the diamond makes it impossible to deposit various films on the surface. Thus, the lack of an effective etching method has hindered us from manufacturing diamond semiconductor devices. The reason why the usual RIE method generates a rough surface on diamond has not been clearly understood yet. One of the probable reasons is that because of the high temperature of the oxygen plasma, the kinetic energy of oxygen ions is so high that the oxygen ions would bombard the diamond crystal with strong impulses. The impulse would produce the roughness of surface. Another possibility is that oxygen ions are moving randomly with various energies and momenta in heated plasma and the impulses of the bombardment are so random that the etching effect would be ununiform.

If ununiform impulses of oxygen ions would induce the roughness of diamond surface, the bombardment of oxygen ions with a common energy and with a common velocity would enable us to etch a diamond surface with high flatness.

However, the reactive ion etching method excites a reactive gas into plasma by applying high frequency electric field between two electrodes in a vacuum chamber. Therefore, there is no means for controlling the energy or velocity of oxygen ions. Oxygen ions gain or lose the momentum or energy by collision with other oxygen ions or electrons. The plasma is in general not kept in thermal equilibrium. The energy of ions is diverse. The average kinetic energy of electrons is higher than the average kinetic energy of ions in spite of frequent collisions between ions and electrons. Thus, the conventional reactive ion etching (RIE) method lacks the means of controlling the energies or momenta of ions in plasma. The strength of electric field would affect the production rate of plasma. However, the energies or momenta of ions cannot be controlled by the strength of electric field.

The purpose of this invention is to provide an etching method of diamond which can etch a diamond surface without concave parts or convex parts in order to fabricate diamond semiconductor devices with high performance.

SUMMARY OF THE INVENTION

The etching method of this invention is characterized in that a metallic controlling grid with holes is installed between plasma and a diamond surface, a controlling voltage is applied to the metallic controlling grid and the diamond surface is etched by the oxygen plasma whose voltage is controlled by the applied voltage to the metallic controlling grid. It is further desirable that the metallic controlling grid forms a network. It is also preferable that the metallic controlling grid is rotating.

The metallic controlling grid should be made of such a material that is not easily etched by oxygen or halogens. For example, a metallic controlling grid can be produced by boring many holes on a metal plate with high melting point, e.g. tungsten (W) or tantalum (Ta). Another type of controlling grid can be produced by coating a metal network with a corrosive-resistant insulator, e.g. ceramics.

In the etching process, oxygen atoms are introduced into the chamber by the molecules including oxygen, e.g. oxygen molecules $O_2$, water $H_2O$, carbon dioxide $CO_2$, etc. Halogens, e.g. chlorine (Cl) or fluorine (F) can be introduced by the molecules including halogens, e.g. carbon tetrachloride ($CCl_4$), hydrogen chloride (HCl), carbon tetrafluoride ($CF_4$) or hydrogen fluoride (HF). Etching gas must include oxygen. However, it is allowable that etching gas is a mixture of oxygen and halogens, hydrogen or rare gases. The most preferable etching gas is a mixture of oxygen (O) and argon (Ar). The pertinent substrate temperature should be below 1000° C. In general, lower temperature will alleviate the tendency to roughness of the surface by the etching. Thus, lower temperature is more desirable.

This invention proposes a method which prevents oxygen plasma or halogen plasma from being directly in contact with diamond by installing a network grid and applying voltage to the network grid to control the potential of plasma. In many cases, oxygen or halogen atoms become ions in plasma by the collision with electrons or ions. Thus, if a metal plate was disposed between a diamond specimen and plasma, the plasma including oxygen ions or halogen ions would be excluded, because the AC (alternating current) electric field would be shielded by the metal plate. However, if the plasma was perfectly excluded from the diamond specimen, the specimen could not be etched at all. Oxygen radicals should reach the surface of diamond by degrees in order to etch it without inducing roughness. Since the network grid disclosed in this invention has many holes or openings, ions, electrons or neutral radicals can pass through the network grid. Controlling the voltage applied to the network grid can select the material and the amount of material which pass through the network grid. Thus, the amount of oxygen ions which will reach the surface of the diamond can be adjusted by controlling the voltage of the network grid.

No space charge like plasma agglomeration lies between the network grid and the diamond specimen. The electric field formed between them is uniquely determined by the shape of the electrodes and the applied voltage. At this point, the space between the network grid and the diamond specimen differs from the space including a plasma agglomeration.

Since a negative voltage is applied to the network grid, oxygen ions (negative ions) lose their velocity or energy near the network grid. The velocity of oxygen ions which pass the network grid becomes nearly zero. The movement of oxygen ions which have passed there is fully controlled by the electric field. Since the electric field is uniformly formed along the direction vertical to the electrode supporting the diamond or to the network grid, the speed or the kinetic energy of oxygen ions which collide with the surface of the diamond will be uniformly determined by the uniform electric field. Thus, the etching action will be uniform in the surface of the diamond, because oxygen ions with the same kinetic energy collide with uniform concentration with the surface of diamond. Due to the uniform action of etching, the surface of diamond will be immune from the roughness. Smooth etched surface will be obtained without formation of concaves or convexes.

The voltage which shall be applied to the network grid can be either direct current (DC) voltage or alternating current (AC) voltage. The metal grid is required only to have holes. However, network grid is the most preferable for ions to pass it freely. If the diameter of a mesh is large, the electric field formed between the network grid and the diamond is likely to become nonuniform. Thus, fine mesh of network is desirable for regulating the electric field. Furthermore, it is desirable to rotate the metal grid in order to equalizing the time average of electric field at all points.

The etching method of this invention can be applied to all semiconductor diamond, e.g. natural bulk diamond, synthesized bulk diamond (high pressure synthesis), film polycrystalline diamond or film monocrystalline diamond (epitaxial film) grown by the vapor phase methods.

Diamond films can be grown by the vapor phase methods, e.g.

① Method for activating the material gas by inducing discharge by direct current (DC) electric field or alternating current (AC) electric field.

② Method for activating the material gas by heating a thermal electron emitter (a filament).

③ Method for bombarding the surface of substrate with ions on which diamond is grown.

④ Method for activating the material gas by light, e.g. laser light or ultraviolet light.

⑤ Method for burning the material gas.

The etching method of this invention is available for all the diamond films which have been grown by the above methods. There has been no effective dry etching method for etching a surface of diamond without impairing the flatness or smoothness of the surface. However, this invention enables us to etch a surface of diamond smoothly. Thus, this invention will be useful for the fabrication of diamond diodes, diamond transistors or diamond integrated circuits which are promising as high output power devices, high frequency devices or high circumstance-resistance devices.

DETAILED DESCRIPTION OF THE EMBODIMENTS

[EMBODIMENT ①]

A diamond film was grown on a synthesized diamond substrate ($I_b$) by the microwave plasma CVD method under the following conditions;

| material gases | $H_2$, $CH_4$, $B_2H_6$ |
|---|---|
| $H_2$ | 100 sccm |
| $CH_4$ | 6 sccm |
| $B_2H_6$(10 ppm) | 5 sccm |
| pressure | 40 Torr |
| microwave power | 300 W |
| time of discharge | 2 h |

The film was grown on the (100) substrate to a thickness of 500 nm (0.5 μm). The electron beam diffraction method (RHEED) confirmed that the film was epitaxially grown in the (100) direction. A metal mask was formed on the diamond film by evaporation coating with aluminum at a vacuum of $1 \times 10^{-6}$ Torr. Thus, some parts of the film were covered by an aluminum layer but the other parts were left uncovered. The uncovered parts would be etched by the method of this invention.

Figure 1:
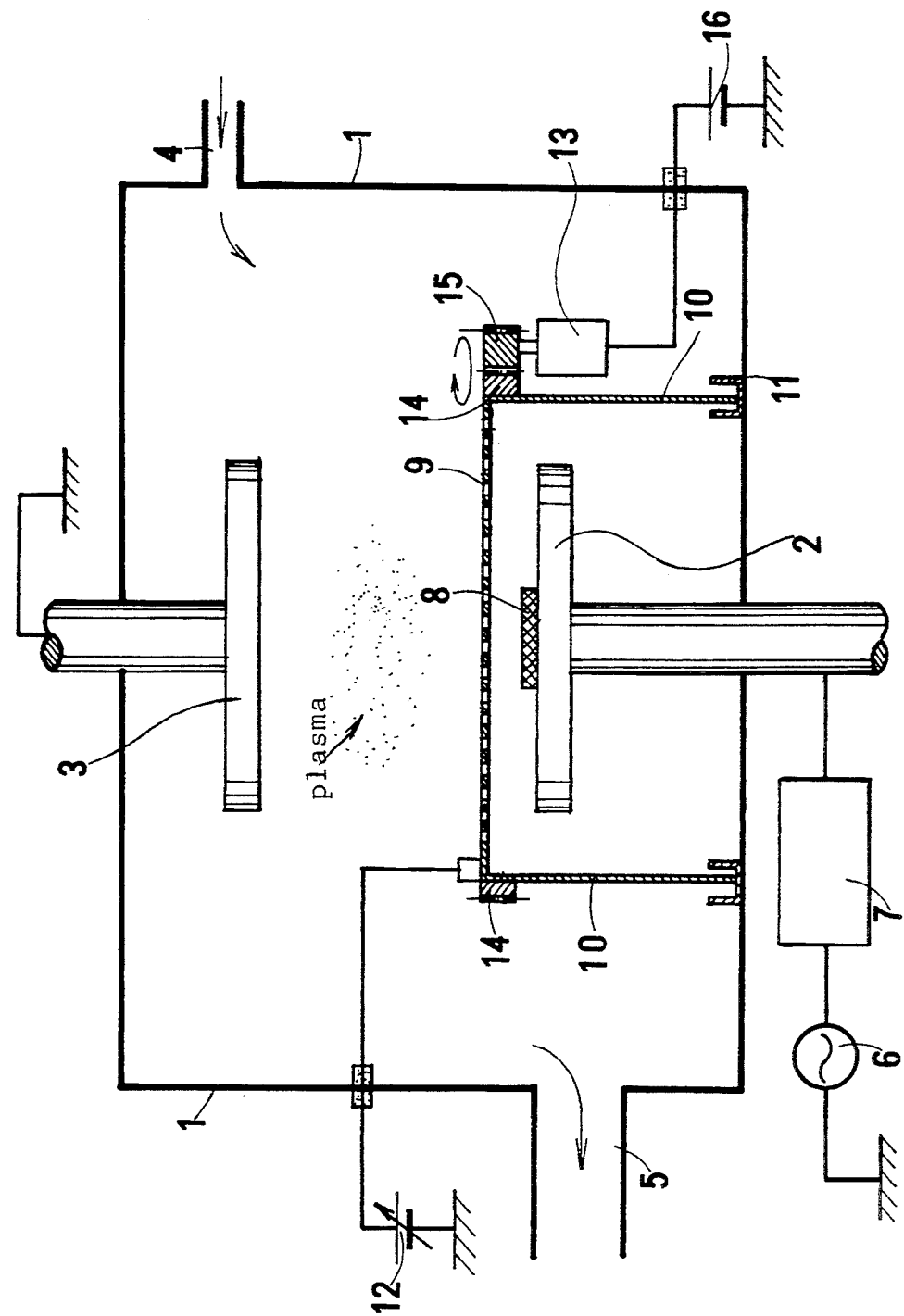
FIG. 1 is a sectional view of an etching apparatus in which this invention is applied.

FIG. 1 shows a schematic view of an RIE (reactive ion etching) apparatus in which this invention is applied. Electrodes (2) and (3) which faced each other were installed along a vertical line in a vacuum chamber (1). The upper electrode (3) was a grounded electrode. The lower electrode (2) was an electrode to which high frequency voltage shall be applied. The vacuum chamber (1) was provided with a gas inlet (4) for introducing a material gas and a gas outlet (5) for exhausting an exhaust gas. The gas outlet (5) communicated with a vacuum pump (not shown in figures). The high frequency electrode (2) was connected in series with a high frequency power source (6) and a matching box (7). A diamond specimen (8) coated with the aluminum mask was laid on the high frequency electrode (2).

In addition to such ordinary parts, this invention installed a metal grid (9) above the high frequency electrode (2). The metal grid (9) could be either metal plate with many holes punched thereon or a metal network. In this case, the periphery of the metal grid (9) was fixed to a cylinder (10). The bottom end of the cylinder (10) upheld the horizontal metal grid (9). A direct-current power source (12) applied voltage to the metal grid (9). The voltage could be controlled by the power source (12). A rotation device (13) was provided at the side of the cylinder (10). A wide, annular gear (14) was fixed around the cylinder (10). Another small gear (15) was fitted on an input shaft of the rotation device (13). The small gear (15) meshed with the annular gear (14). A power source (16) supplied electric power to the rotation device (13). Thus, the small gear (15) rotated. The annular gear (14) rotated slowly. The cylinder (10) and the metal grid (9) rotated at the same speed as the gear (14). A high frequency electric field was applied between the electrodes (2) and (3). An etching gas was introduced from the gas inlet (4) into the vacuum chamber (1). In this case, the etching gas consisted only of oxygen. A pertinent negative voltage was applied to the metal grid (9) by the power source (12).

Figure 3:
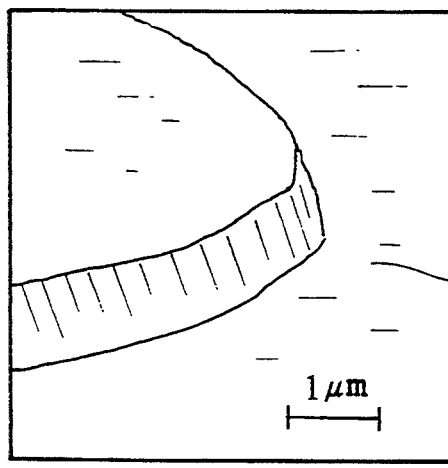
FIG. 3 is a schematic microscopic view of a surface of a diamond specimen etched by utilizing a controlling grid according to the teaching of this invention.

FIG. 3 shows the surface of diamond etched by the method of the embodiment ①. The left-hand step is unetched part. The right-hand flat part is an etched part. The surface roughness of the etched part was less than 3 nm.

Figure 4:
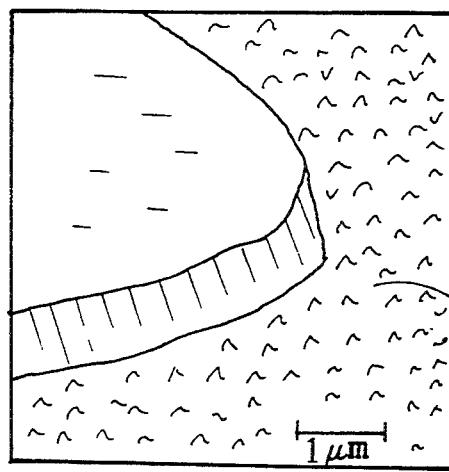
FIG. 4 is a schematic, microscopic view of a surface of a diamond specimen etched without a controlling grid according to the conventional method.

FIG. 4 shows the surface of diamond etched without the metal grid (9). The left-hand step is unetched part. The right-hand part is an etched part. The etched part had many small convexes and concaves. The rugged surface was produced by the random, strong bombardment of oxygen ions which had high, diverse kinetic energy. This experiment eloquently showed the advantage of this invention. Furthermore, another etching experiment was carried out by using another etching gas including hydrochrolicacid HCl, or tetrafluorocarbon $CF_4$ in addition to oxygen. Adding HCl or $CF_4$ to oxygen did not affect the result of the etching.

[EMBODIMENT ②]

Diamond films were grown by the same method and the same conditions on a synthesized bulk diamond substrate (II$_b$) made by the high pressure synthesis. The size of the substrate was 2 mm×1.5 mm×0.3 mm.

One specimen of the diamond films was coated with an aluminum mask by evaporation. The other specimen was coated with an $SiO_2$ (silicon dioxide) mask by the ion plating method. Namely one mask was metal, but the other mask was insulator. Two kinds of specimens were etched in the apparatus shown in FIG. 1 by the plasma including oxygen. A pertinent voltage was applied to the metal grid (9). The surface roughness of the etched surfaces was less than 3 nm both for the aluminum-masked specimen and the $SiO_2$-masked specimen. This result showed that the potential regulation by the metal grid was effective both to a metal mask and an insulator mask.

[EMBODIMENT ②]

Figure 2:
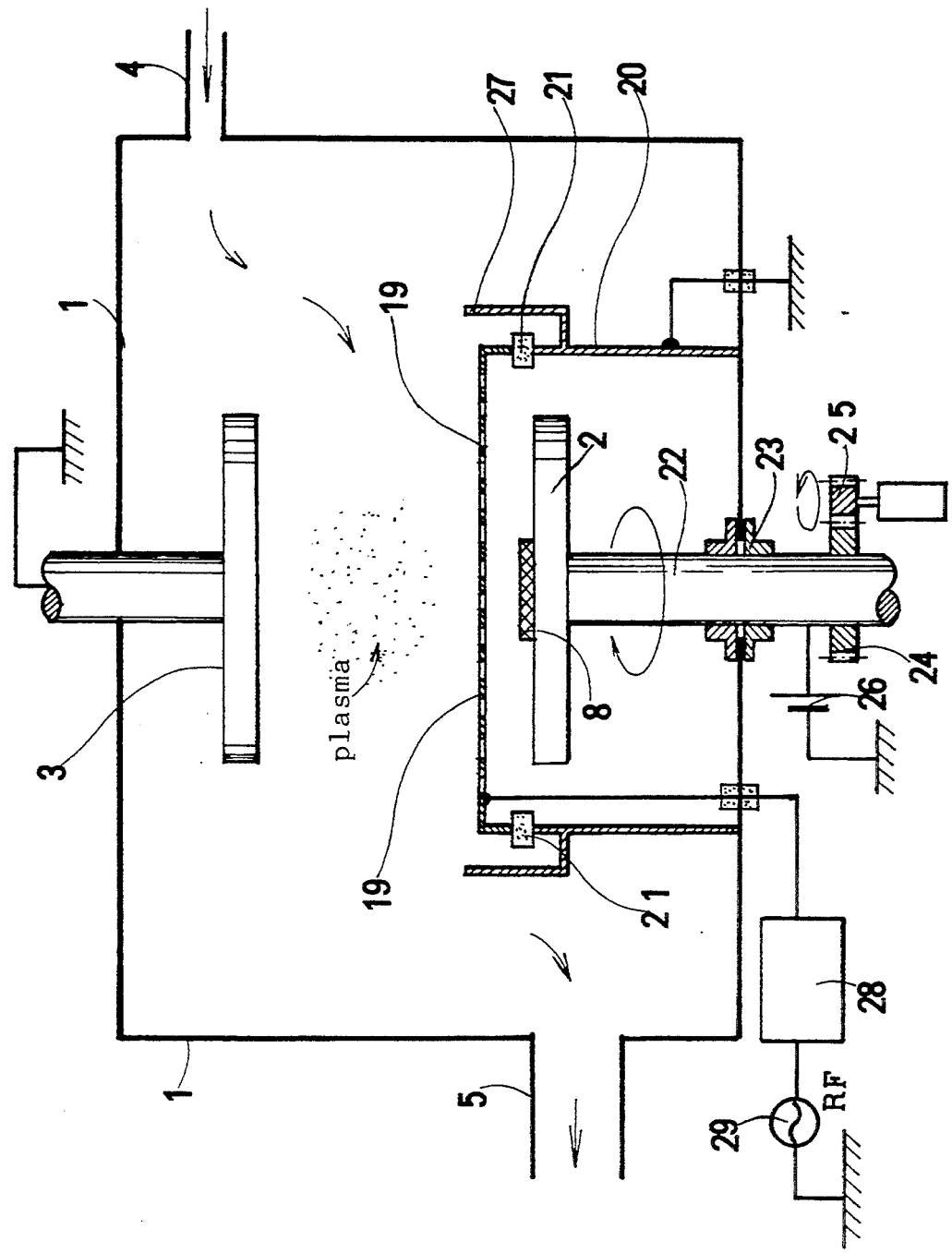
FIG. 2 is a sectional view of another etching apparatus in which this invention is realized.

The diamond films made by the same method and conditions as embodiment ①, were etched by the plasma including oxygen in an etching apparatus shown in FIG. 2. Electrodes (2) and (3) which face each other were installed in a vacuum chamber (1). The upper electrode (3) was a grounded electrode. The lower electrode (2) was an electrode on which a specimen would be laid to be etched. The vacuum chamber (1) had a gas inlet (4) and a gas outlet (5). A metal grid (19) was supported via an insulator (21) on a cylinder (20). The metal grid (19) could be either a metal plate punched with many holes or a metal network. The lower electrode (2) was supported by a rotating shaft (22). In this embodiment, the metal grid (19) was at rest, but the specimen (8) was rotating. The rotation of the specimen was equivalent to the rotation of the metal grid from the stand point of uniforming the etching action.

A bearing (23) was provided to the vacuum chamber (1) in order to sustain the rotating shaft (22) without breaking the vacuum. A gear (24) was fitted around the rotating shaft (22). A gear (25) which was fitted to an output shaft of a motor meshed with the gear (24). Thus the motor rotated the rotating shaft (22) and the lower electrode (2). A power source (26) applied positive voltage to the lower shaft (2) through the shaft (22). The cylinder (20) was grounded. A cover (27) was fixed around the upper part of the cylinder (20). Since the cover (27) which was grounded enclosed the metal grid (19), the lines of electric field were reformed to be nearly vertical to the surface of the grid (19). The ions which had passed through a hole of the grid (19) and had small kinetic energy were driven by the action of electric field in the direction vertical to the grid (19) and the electrode (2). Thus, the direction of motion and the kinetic energy of ions were nearly uniform on the surface of the specimen.

A matching box (28) and a RF (radiofrequency) power source (29) were connected in series to the metal grid (19). The voltage of the grid (19) was oscillating in high frequency with a certain amplitude which could be controlled by the power source (29). An etching gas including oxygen was introduced from the gas inlet (4). The etching gas was excited into plasma by the action of the RF electric field formed between the upper, grounded electrode (3) and the lower, RF-oscillating grid (19). Oxygen ions accelerated once by the electric field were decelerated when they passed the metal grid (19). They lost nearly all of the kinetic energy once near the grid (19). Then they were again accelerated by the electric field between the metal grid (19) and the lower electrode (2). Oxygen ions bombarded the surface of specimen with uniform kinetic energy. Thus, the surface was etched to a smooth surface without concaves or convexes. The surface roughness of the etched surface was less than 3 nm similarly to embodiment ①.

[EMBODIMENT ④]

Figure 5:
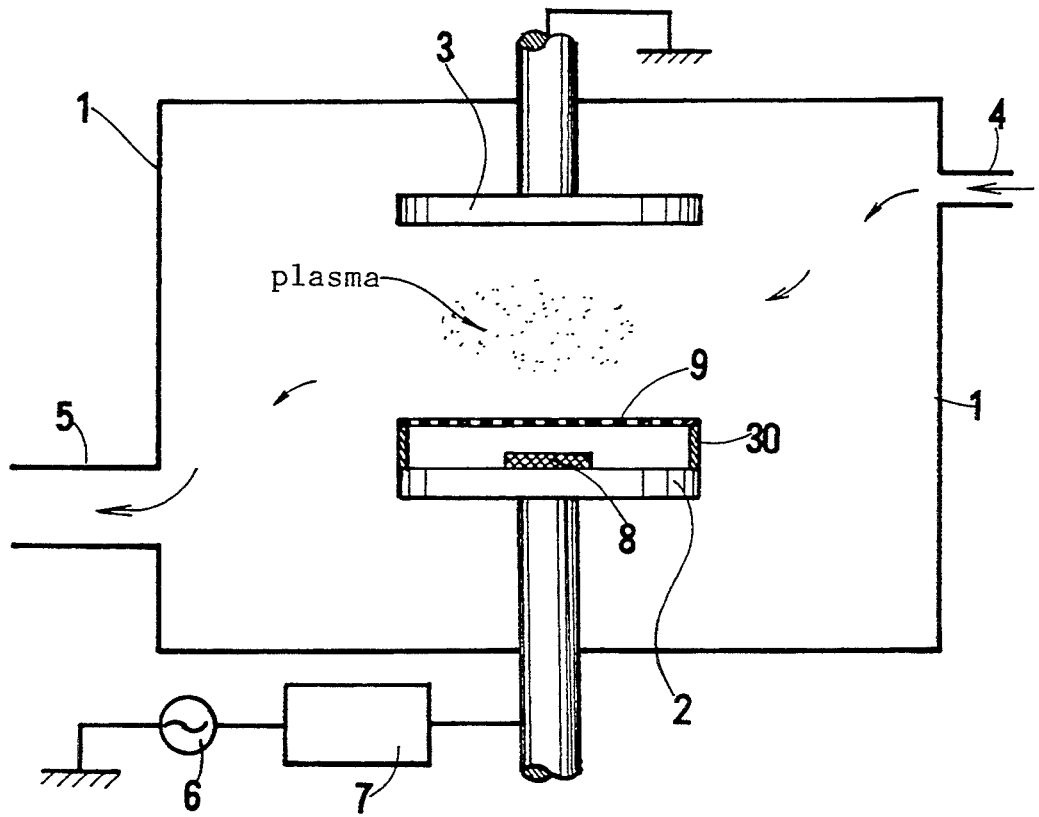
FIG. 5 is a sectional view of another etching apparatus in which this invention is realized.

The diamond films were grown on a diamond substrate by the same method and conditions as embodiment ①. The diamond specimens were etched by the apparatus shown by FIG. 5. In the apparatus, the lower electrode (2) was biased to RF oscillating voltage by the power source (6). A metal grid (9) was supported by an insulator cylinder which was laid on the lower, RF biased electrode (2). The metal grid (9) was not biased positively unlike the embodiments ① to ③. The metal grid (9) would be naturally biased by the motion of plasma, although the bias voltage could not be controlled. The metal grid (9) could also decelerate oxygen ions which had passed through the holes of the metal grid (9). Then, the oxygen ions would be accelerated to the same kinetic energy by the voltage between the metal grid (9) and the lower electrode (2). The diamond film which was etched by the apparatus was confirmed to have as smooth surface as the embodiment ① to ③ without concaves and convexes. This embodiment was simplified with regard to the bias of the metal grid (9).

What we claim is:

1. Etching method for etching diamond with oxygen plasma in a reactive etching apparatus having two electrodes, a gas inlet, a gas outlet and a vacuum pump, comprising the steps of mounting a diamond specimen on one electrode, introducing an etching gas including oxygen, activating the etching gas into plasma including oxygen ions by applying AC voltage or DC voltage between two electrodes and etching the surface of the diamond specimen by bombarding oxygen ions, characterized in that a metal grid with holes is installed between the plasma and the diamond specimen, some voltage is applied to the metal grid, the metal grid is rotated around a vertical axis and the diamond is etched by the oxygen ions with nearly the same kinetic energy by controlling the voltage of plasma by regulating the voltage applied to the metal grid.

2. Etching method for etching diamond with oxygen plasma in a reactive etching apparatus having two electrodes, a gas inlet, a gas outlet and a vacuum pump, comprising the steps of mounting a diamond specimen on one electrode, rotating the electrode supporting the diamond specimen around a vertical axis, introducing an etching gas including oxygen, activating the etching gas into plasma including oxygen ions by applying AC voltage or DC voltage between two electrodes and etching the surface of the diamond specimen by bombarding oxygen ions, characterized in that a metal grid with holes is installed between the plasma and the diamond specimen, some voltage is applied to the metal grid and the diamond is etched by the oxygen ions with nearly the same kinetic energy by controlling the voltage of plasma by regulating the voltage applied to the metal grid.

3. Etching method for etching diamond with oxygen plasma in a reactive etching apparatus having two electrodes, a gas inlet, a gas outlet and a vacuum pump, comprising the steps of mounting a diamond specimen on one electrode, introducing an etching gas including oxygen, activating the etching gas into plasma including oxygen ions by applying AC voltage or DC voltage between two electrodes and etching the surface of the diamond specimen by bombarding oxygen ions, characterized in that a metal grid with holes is mounted with an insulator cylinder on the electrode supporting the diamond specimen, the metal grid is naturally biased by the potential of the plasma, and the diamond is etched by the oxygen ions with nearly the same kinetic energy.

* * * * *